United States Patent [19]
Kim

[11] Patent Number: 5,418,790
[45] Date of Patent: May 23, 1995

[54] INTERFERENCE GRASPING TEST MODE CIRCUIT FOR A SEMICONDUCTOR MEMORY DEVICE

[75] Inventor: Jong H. Kim, Seoul, Rep. of Korea

[73] Assignee: Goldstar Electron Co., Ltd., Rep. of Korea

[21] Appl. No.: 995,974

[22] Filed: Dec. 23, 1992

[30] Foreign Application Priority Data

Dec. 23, 1991 [KR] Rep. of Korea ............... 23411/1991

[51] Int. Cl.$^6$ .............................................. G11C 29/00
[52] U.S. Cl. .................................. 371/21.1; 371/22.1; 365/201
[58] Field of Search ............ 371/21.1, 22.1, 21.2–21.3; 365/201

[56] References Cited

U.S. PATENT DOCUMENTS

5,016,220 5/1991 Yamagata ............................ 371/21.1
5,148,398 9/1992 Kohno .................................. 371/21.1
5,157,629 10/1992 Sato et al. ............................ 371/21.4

*Primary Examiner*—Hoa T. Nguyen
*Attorney, Agent, or Firm*—Poms, Smith, Lande & Rose

[57] ABSTRACT

A test mode circuit for a memory device for, in a test mode, transforming information to be stored in the memory device and information being read from the memory device and selecting simultaneously information stored in cell arrays in the memory device, so as to grasp interferences between adjacent cells and between adjacent data bus lines. The circuit comprises a cell array section having a plurality of cell arrays for storing input data therein, a first switching section for selecting one of test and normal modes and selecting one of the plurality of cell arrays in the normal mode, a first logic section for transferring desired information simultaneously to the cell array section in response to a clock signal in the test mode, a second logic section responsive to the clock signal for outputting directly output data signals from the plurality of cell arrays or inverting the data signals and outputting the inverted data signals, a third logic section for, in the test mode, inputting output signals from the second logic section and discriminating whether the data signals from the plurality of cell arrays are the same, and a second switching section for selecting, as its output signal, an output, signal from the third logic section in the test mode and the data signal from the selected one of cell arrays in the normal mode.

15 Claims, 3 Drawing Sheets

INTERFERENCE GRASPING TEST MODE CIRCUIT FOR A SEMICONDUCTOR MEMORY DEVICE

BACKGROUND OF THE INVENTION

1. Field of the Invention

The present invention relates in general to a test mode circuit for a memory device, and more particularly to a test mode circuit, for a memory device for, in a test mode, transforming information to be stored in the memory device and information being read from the memory device and selecting simultaneously information stored in cell arrays in the memory device, so as to grasp interferences between adjacent cells and between adjacent data bus lines in the memory device.

2. Description of the Prior Art

Figure 1:
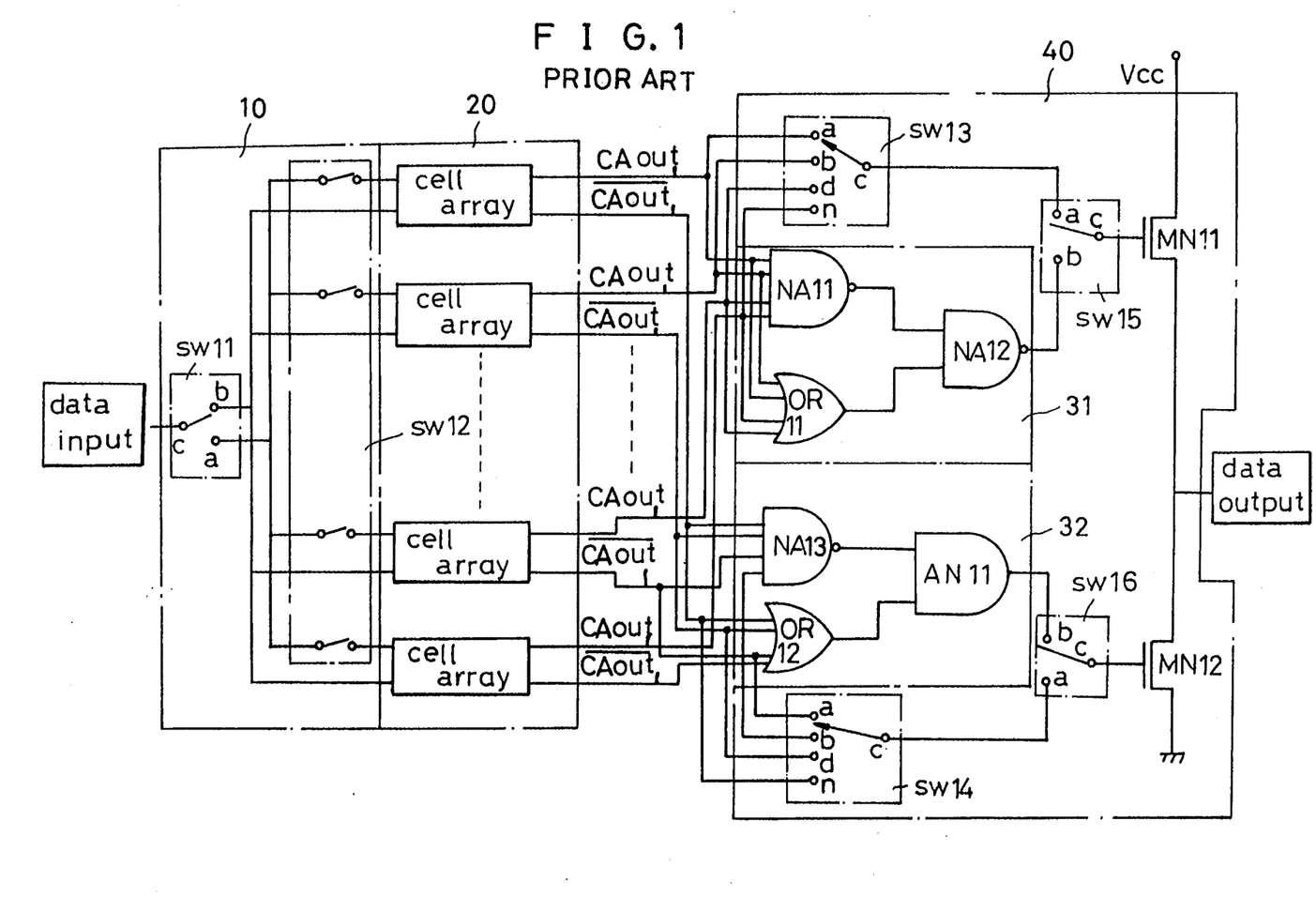
FIG. 1 is a circuit diagram of a conventional test mode circuit for a memory device.

Referring to FIG. 1, there is shown a circuit diagram of a conventional test mode circuit for a memory device. As shown in this drawing, the conventional memory device test mode circuit comprises a cell array section 20 having a plurality of cell arrays CA1-CAn for storing input data Din herein, a first switching section 10 for selecting one of test and normal modes and selecting one of the plurality of cell arrays CA1-CAn in the cell array section 20 in the normal mode, the input data Din being stored in only one of the plurality of cell arrays CA1-CAn selected by the first switching section 10 in the normal mode and being simultaneously stored in the plurality of cell arrays CA1-CAn in the test mode, a logic section 30 for inputting output data signals CAout from the plurality of cell arrays CA1-CAn in the cell array section 20 and discriminating whether the data signals CAout from the plurality of cell arrays CA1-CAn are the same, and a second switching section 40 for selecting one of the test and normal modes and selecting, as its output signal Dout, an output signal from the logic section 30 in the test mode and the data signal CAout from the selected one of the plurality of cell arrays CA1-CAn in the cell array section 20 in the normal mode.

The first switching section 10 includes a mode select switch SW11 having a movable contact c and fixed contacts a and b for inputting the input data Din, the movable contact c being connected to the fixed contact a in the normal mode and to the fixed contact b in the best mode, and a plurality of cell array select switches SW12, each having its one terminal connected to the fixed contact a of the switch SW11 and its other terminal connected to a corresponding one of the cell arrays CA1-CAn in the cell array section 20, for, in the normal mode, selecting one of the plurality of cell arrays CA1-CAn so that the input data Din through the contacts c and a of the switch SW11 is stored in the selected one of the plurality of cell arrays CA1-CAn.

The cell array section 20 consists of the plurality of cell arrays CA1-CAn, each of which includes a plurality of memory cells arranged in the form of matrix to store the input data applied through the switch SW11 in the switching section 10. Inputs of the plurality of cell arrays CA1-CAn are also connected directly to the fixed contact b of the switch SW11 in the switching section 10. In the normal mode, one of the plurality of cell arrays CA1-CAn is selected by a corresponding one of the cell array select switches SW12 in the switching section 10, thereby to store the input data. In the test mode, the input data is applied simultaneously to the plurality of cell arrays CA1-CAn through the switch SW11 in the switching section 10.

The logic section 30 includes first discriminating means 31 for inputting the output data signals CAout from the plurality of cell arrays CA1-CAn in the cell array section 20 and discriminating whether the data signals CAout from the plurality of cell arrays CA1-CAn are the same, and second discriminating means 32 for inputting inverted output data signals /CAout from the plurality of cell arrays CA1-CAn in the cell array section 20 and discriminating whether a different data signal is outputted from any one of the plurality of cell arrays CA1-CAn.

The first discriminating means 31 includes NAND and OR gates NA11 and OR11 for inputting the output data signals CAout from the plurality of cell arrays CA1-CAn in the cell array section 20 and a NAND gate NA12 for inputting output signals from the NAND and OR gates NA11 and OR11.

The second discriminating means 32 includes NAND and OR gates NA13 and OR12 for inputting the inverted output data signals /CAout from the plurality of cell arrays CA1-CAn in the cell array section 20 and an AND gate AN11 for inputting output signals from the NAND and OR gates NA13 and OR12.

The second switching section 40 includes a first cell array select switch SW13 having a movable contact c and a plurality of fixed contacts a, b, d, e . . . n for inputting the output data signals CAout from the plurality of cell arrays CA1-CAn in the cell array section 20, for selecting one of the output data signals CAout from the plurality of cell arrays CA1-CAn in the normal mode, a second cell array select switch SW14 having a movable contact c and a plurality of fixed contacts a, b, d, e . . . n for inputting the inverted output data signals /CAout from the plurality of cell arrays CA1-CAn in the cell array section 20, for selecting one of the inverted output data signals /CAout from the plurality of cell arrays CA1-CAn in the normal mode, a first mode select switch SW15 having a movable contact c and fixed contacts a and b, the movable contact c being, in the normal mode, connected to the fixed contact a to select the output data signal from the cell array selected by the switch SW13 and, in the test mode, connected to the fixed contact b to select an output signal from the first discriminating means 31 in the logic section 30, and a second mode select switch SW16 having a movable contact c and fixed contacts a and b, the movable contact c being, in the normal mode, connected to the fixed contact a to select the inverted output data signal from the cell array selected by the switch SW14 and, in the test mode, connected to the fixed contact b to select an output signal from the second discriminating means 32 in the logic section 30. The second switching section 40 also includes a first N type MOS transistor MN11 for outputting the output data signal from the cell array section 20 or the output signal from the first discriminating means 31 in the logic section 30 in response to the operation of the switch SW15, and a second N type MOS transistor MN12 for outputting the inverted output data signal from the cell array section 20 or the output signal from the second discriminating means 32 in the logic section 30 in response to the operation of the switch SW16.

The operation of the conventional memory device test mode circuit with the above-mentioned construction will hereinafter be described.

In the normal mode, the movable contact c of the mode select switch SW11 in the first switching section 10 is connected to the fixed contact a thereof in response to an external control signal and one of the plurality of cell array select switches SW12 in the first switching section 10 is selected, thereby to select a corresponding one of the plurality of cell arrays CA1-CAn in the cell array section 20. Input data Din is stored in the memory cell of the selected cell array.

The data stored in this manner in the selected cell array CA is sensed by the second switching section 40 for its output. At this time, in the second switching section 40, the movable contacts c of the cell array select switches SW13 and SW14 are connected to the respective ones of the fixed contacts a, b, d, e ... n thereof and the movable contacts c of the mode select switches SW15 and SW16 are connected to the fixed contacts a thereof, respectively.

Accordingly, the output signal CAout from the selected cell array CA is applied to a gate terminal of the N type MOS transistor MN11 through the switches SW13 and SW15, thereby allowing the data Dout to be outputted from the N type MOS transistor MN11. On the other hand, the inverted output signal /CAout from the selected cell array CA is applied to a gate terminal of the N type NOS transistor MN12 through the switches SW14 and SW16, thereby allowing the data Dout to be outputted from the N type MOS transistor MN12.

In the test mode, the movable contact c of the mode select switch SW11 in the first switching section 10 is connected to the fixed contact b thereof in response to an external control signal, to apply the input data Din simultaneously to the plurality of cell arrays CA1-CAn in the cell array section 20. The input data Din is stored simultaneously in shortened addresses of the cell arrays CA1-CAn.

The data stored in this manner in the cell arrays CA1-CAn is sensed by the logic section 30 for its output. At this time, in the case where the same data of logic 1 or 0 are outputted from the plurality of CA1-CAn, the output of the NAND gate NA12 of the first discriminating means 31 in the logic section 30 is logic 1. Since the movable contact C of the mode select switch SW15 is connected to the fixed contact b thereof in the test mode, the output of the first discriminating means 31 is applied to the gate terminal of the MOS transistor MN11 through the switch 15. As a result, the MOS transistor MN11 is tutored on, thereby causing the output data Dout to become logic 1.

On the other hand, when at least one different data is outputted from the plurality of cell arrays CA1-CAn due to a failure of the memory device, the output of the AND gate AN11 of the second discriminating means 32 in the logic section 30 becomes logic 1. The logic 1 signal is applied to the gate terminal of the MOS transistor MN12 through the switch SW16. As a result, the MOS transistor MN12 is turned on, thereby causing the output data Dout to become logic 0.

Accordingly, the presence of a failure of the memory device is tested on the basis of the logical state of the output data Dout.

The method of testing the memory device as mentioned above is generally classified into a method of repeatedly performing the above-mentioned operation of selecting the memory cells in the plurality of cell arrays, storing the data simultaneously in the memory cells and reading the data and a method of repeatedly performing an operation of selecting a plurality of adjacent memory cells in one of the plurality of cell arrays, storing the data simultaneously in the memory cells and reading the data.

However, the conventional memory device test mode circuit has a disadvantage, in that, in the case where it selects the plurality of adjacent memory cells in one of the plurality of cell arrays for the test of the memory device, it cannot grasp interferences between the adjacent cells and between adjacent data bus lines in the memory device, since the information to be stored in the memory device is inputted simultaneously through only the one terminal in the test mode.

SUMMARY OF THE INVENTION

Therefore, the present invention has been made in view of the above problem, and it is an object of the present invention to provide a test mode circuit for a memory device for, in a test mode, transforming information to be stored in the memory device and information being read from the memory device and selecting simultaneously information stored in cell arrays in the memory device, so as to grasp interferences between adjacent cells and between adjacent data bus lines in the memory device.

In accordance with the present invention, the above object can be accomplished by a provision of a test mode circuit for a memory device, comprising: cell array means having a plurality of cell arrays for storing input data therein; first switching means including a mode select switch for selecting one of test and normal modes in response to an external control signal and a plurality of cell array select switches for selecting one of the plurality of cell arrays in said cell array means in the normal mode in response to an external control signal; first logic means responsive to a clock signal for, in the test mode, transferring the input data applied through said first switching means directly and simultaneously to the plurality of cell arrays in said cell array means or inverting the input data and the inverted data simultaneously to the plurality of cell arrays in said cell array means; second logic means responsive to the clock signal for outputting directly output data signals from the plurality of cell arrays in said cell array means or inverting the data signals and outputting the inverted data signals; third logic means including first discriminating means for, in the test mode, inputting the output data signals from said second logic means and discriminating whether the inputted data signals are the same and second discriminating means for, in the test mode, inputting the inverted output data signals from said second logic means and discriminating whether a different data signal is outputted from any one of the inputted inverted data signals; and second switching means including a first cell array select switch for selecting one of the output data signals from the plurality of cell arrays in the normal mode, a second cell array select switch for selecting one of the inverted output data signals from the plurality of cell arrays in the normal mode, a first mode select switch for selecting the output data signal from the cell array selected by said first cell array select switch, in the normal mode, and an output signal from said first discriminating means in said third logic means in the test mode, and a second mode select switch for selecting the inverted output data signal from the cell array selected by said second cell array select switch, in the normal mode, and an output signal from said second discriminating means in said third logic means in the test mode.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 2:
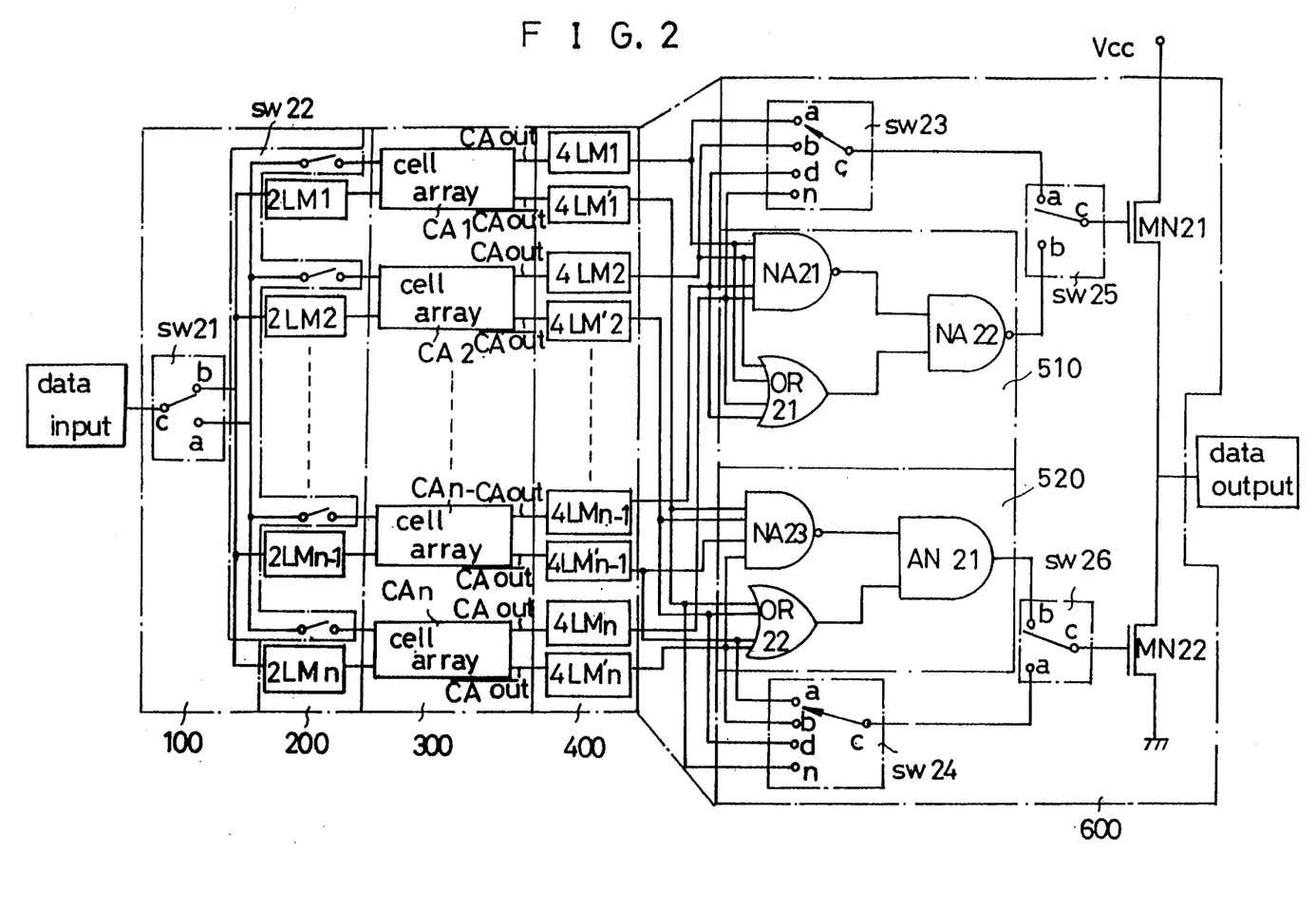
FIG. 2 is a circuit diagram of a test mode circuit for a memory device in accordance with an embodiment of the present invention.

Referring to FIG. 2, there is shown a circuit diagram of a test mode circuit for a memory device in accordance with an embodiment of the present invention. As shown in this drawing, the memory device test mode circuit of the present invention comprises a cell array section 300 having a plurality of cell arrays CA1-CAn for storing input data Din therein, a first switching section 100 for selecting one of test and normal modes and selecting one of the plurality of cell arrays CA1-CAn in the cell array section 300 in the normal mode, a first logic section 200 for transferring desired information simultaneously to the cell array section 300 in response to a clock signal CLK in the test mode, a second logic section 400 responsive to the clock signal CLK for outputting directly output data signals from the plurality of cell arrays CA1-CAn in the cell array section 300 or inverting the data signals and outputting the inverted data signals, a third logic section 500 for, in the test mode, inputting output signals from the second logic section 400 and discriminating whether the data signals from the plurality of cell arrays CA1-CAn are the same, and a second switching section 600 for selecting, as its output signal, an output signal from the third logic section 500 in the test mode and the data signal from the selected one of the plurality of cell arrays CA1-CAn in the cell array section 300 in the normal mode.

Herein, constructions and operations of the first switching section 100, the second switching section 600 and the third logic section 500 in FIG. 2 are the same as those of the first switching section 10, the second switching section 40 and the logic section 30 in FIG. 1 and thus a description thereof will be omitted.

The first logic section 200 includes a plurality of logic means 2LM1-2LMn for applying the input data Din through a mode select switch SW21 in the first switching section 100 simultaneously to corresponding ones of the plurality of cell arrays CA1-CAn in the cell array section 300.

Figure 3:
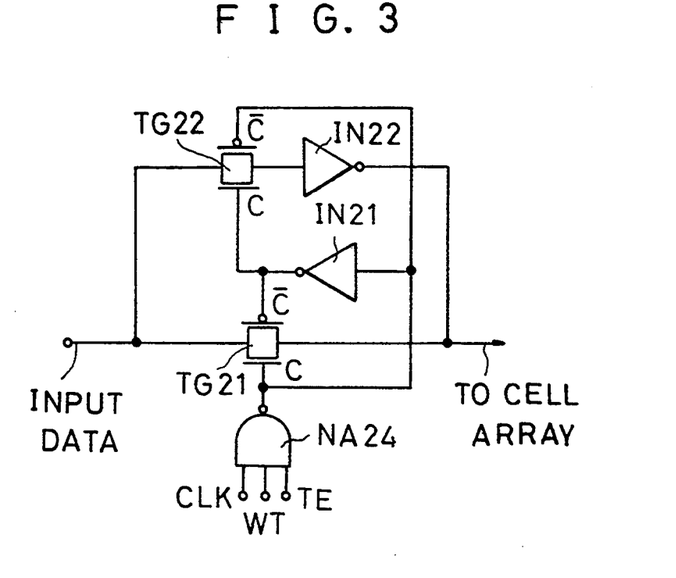
FIG. 3 is a detailed circuit diagram of logic means of a first logic section in the circuit of FIG. 2.

Referring to FIG. 3 there is shown a detailed circuit diagram of each of the logic means 2LM1-2LMn in the first logic section 200. As shown in this figure, the logic means 2LM1-2LMn each is provided with a NAND gate NA24 for inputting the clock signal CLK, a write enable signal WT and a test mode select signal TE and outputting a transfer gate control signal c in response to the inputted signals, an inverter gate IN21 for inverting the output signal from the NAND gate NA24 to output a transfer gate control signal c, a first transfer gate TG21 for transferring directly the input data Din through contacts c and b of the switch SW21 in the first switching section 100 to a corresponding one of the cell arrays CA1-CAn in response to the control signals c and /c from the NAND gate NA24 and the inverter gale IN21, a second transfer gate TG22 for transferring the input data Din through the contacts c and b of the switch SW21 in response to the control signals c and /c from the inverter gate IN21 and the NAND gate NA24, and an inverter gate IN22 for inverting the input data Din transferred through the second transfer gate TG22 and outputting the inverted input data to the corresponding one of the cell arrays CA1-CAn.

Referring again to FIG. 2, the second logic section 400 includes a plurality of first logic means 4LM1-4LMn each for applying the output data signal CAout from a corresponding one of the plurality of cell arrays CA1-CAn in the cell array section 300 to a first cell array select switch SW23 in the second switching section 600 or to first discriminating means 510 in the third logic section 500, and a plurality of second logic means 4LM1'-4LMn' each for applying the inverted output data signal /CAout from a corresponding one of the plurality of cell arrays CA1-CAn in tile cell array section 300 to a second cell array select switch SW24 in the second switching section 600 or to second discriminating means 520 in the third logic section 500.

Namely, the plurality of first logic means 4LM1-4LMn each applies the output data signal CAout from the corresponding one of the plurality of cell arrays CA1-CAn to the first cell array select switch SW23 in the second switching section 600 in the normal mode and to the first discriminating means 510 in the third logic section 500 in the test mode. Also, the plurality of second logic means 4LM1'-4LMn' each applies the inverted output data signal /CAout from the corresponding one of the plurality of cell arrays CA1-CAn to the second cell array select switch SW24 in the second switching section 600 in the normal mode and to the second discriminating means 520 in the third logic section 500 in the test mode.

Figure 4:
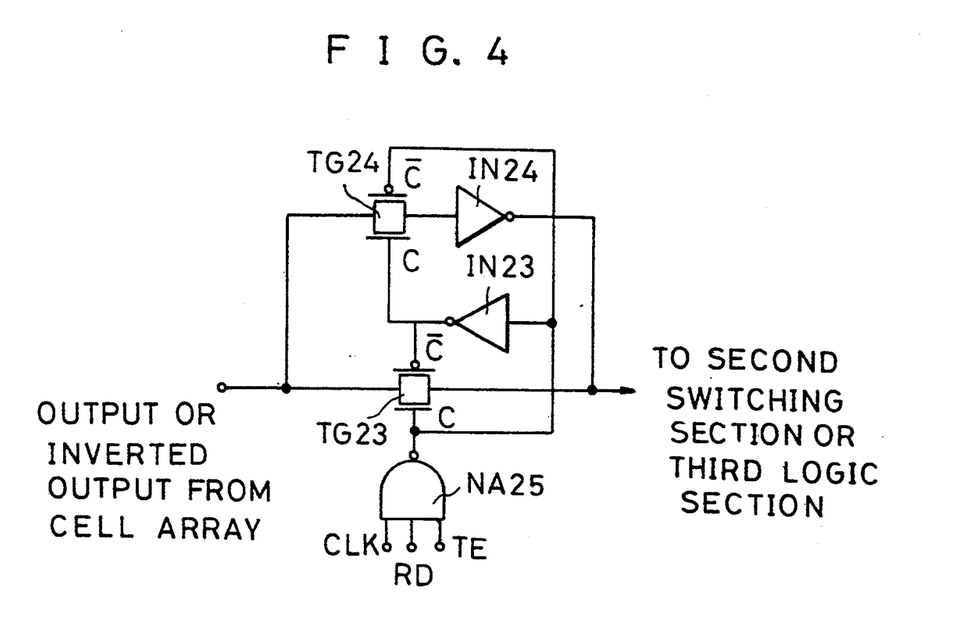
FIG. 4 is a detailed circuit diagram of logic means of a second logic section in the circuit of FIG. 2.

Referring to FIG. 4, there is shown a detailed circuit diagram of each of the first and second logic means 4LM1-4LMn and 4LN1'-4LNn' of the second logic section 400. It is noted herein that the first and second logic means 4LM1-4LMn and 4LM1'-4LMn' are of the same construction. As shown in this figure, the logic means 4LM1-4LMn and 4LM1'-4LMn' each is provided with a NAND gate NA25 for inputting the clock signal CLK, a read enable signal RD and a test mode select signal TE and outputting a transfer gate control signal c in response to the inputted signals, an inverter gate IN23 for inverting the output signal from the NAND gate NA25 to output a transfer gate control signal c, a first transfer gate TG23 for transferring directly the output signal CAout or the inverted output signal /CAout from the corresponding one of the plurality of cell arrays CA1-CAn to the third logic section 500 or the second switching section 600 in response to the control signals c and /c from the NAND gate NA25 arid the inverter gate IN23, a second transfer gate TG24 for transferring the output signal CAout or the inverted output signal /CAout from the corresponding one of the plurality of cell arrays CA1-CAn in response to the control signals c and /c from the inverter gate IN23 and the NAND gate NA25, and an inverter gate IN24 for inverting the output signal CAout or the inverted output signal /CAout from the corresponding one of the plurality of cell arrays CA1-CAn transferred through the second transfer gate TG24 and outputting the inverted signal to the third logic section 500 or the second switching section 600.

The operation of the memory device test mode circuit with the above-mentioned construction in accordance with the present invention will hereinafter be described in detail.

The operation of the memory device test mode circuit of the present invention in FIG. 2 in the normal mode is substantially the same as that of the circuit in FIG. 1. Namely, in the first and second logic means 4LM1-4LMn and 4LMI'-4LMn' of the second logic section 400 in FIG. 4, since the test mode select signal TE is logic 0 in the normal mode, the outputs of the NAND gates NA25 are logic 1 regardless of other inputs, thereby causing only the first transfer gates TG23 to be driven. As a result, the second logic section 400 has no effect on the output signals CAout and the inverted output signals /CAout from the cell arrays in the normal mode. In result, in the normal mode, the output signal CAout or the inverted output signal /CAout from a selected one of the cell arrays is outputted as the final output signal Dout according to the switching operation of the second switching section 600.

In the test mode, the contacts c and b of the mode select switch SW21 in the first switching section 100 are connected to each other in response to an external control signal, thereby causing the input data Din to be applied to the plurality of logic means 2LM1-2LMn in the first logic section 200, respectively. In the logic means 2LM1-2LMn in the first logic section 200 in FIG. 3, the test mode select signal TE is logic 1 resulting from selection of the test mode and the write enable signal WT is logic 1 for data storage into the cell arrays CA1-CAn.

As a result, the output of the NAND gate NA24 logically varies with the logical state of the clock signal CLK. The path along which the input data Din is transferred to the cell arrays is determined according to the outputs of the NAND gates NA24.

That is, when the clock signal CLK is logic 0, the outputs of the NAND gates NA24 are logic 1, thereby causing the first transfer gates TG21 to be turned on and the second transfer gates TG22 to be turned off. For this reason, the input data Din is applied simultaneously to the plurality of cell arrays CA1-CAn in the cell array section 300 through the first transfer gates TG21 in the logic means 2LM1-2LMn, with no variation.

On the other hand, when the clock signal CLK is logic 1, the outputs of the NAND gates NA24 are logic 0, thereby causing the first transfer gates TG21 to be turned off and the second transfer gates TG22 to be turned on. For this reason, the input data Din is inverted through the second transfer gates TG22 and the inverter gates IN22 and applied simultaneously to the plurality of cell arrays CA1-CAn in the cell array section 300.

As mentioned above, in accordance with the present invention, different data can, in the test mode, be stored in the plurality of cell arrays CA1-CAn according to the logical state of the clock signal CLK which is applied to the logic means 2LM1-2LMn in the first logic section 200, differently from the conventional method in which the same data is stored in the cell arrays CA1-CAn in the test mode.

The operation of reading the data from the plurality of cell arrays CA1-CAn in the test mode in accordance with the present invention will hereinafter be described with reference to FIG. 4.

In the case where the data are read from the plurality of cell arrays CA1-CAn under the condition that the test mode is selected, the test mode select signal TE and the read enable signal RD are logic 1. As a result, the path along which the data are read from the cell arrays CA-CAn is determined according to the logical state of the clock signal CLK.

That is, in the first and second logic means 4LH1-4LHn and 4LH1'-4LMn' of the second logic section 400, the outputs of the NAND gates NA25 are logic 1 when the clock signal CLK is logic 0, thereby causing the first transfer gates TG23 to be burned on and the second transfer gates TG24 to be turned off. As a result, the information stored in the cell arrays CA1-CAn are simultaneously outputted directly through the first transfer gates TG23 in the first and second logic means 4LM1-4LMn and 4LM1'-4LMn' of the second logic section 400.

On the other hand, when the clock signal CLK is logic 1, the outputs of the NAND gages NA25 are logic 0, thereby causing the first transfer gates TG23 to be turned off and the second transfer gates TG24 to be turned on. As a result, the information stored in the cell arrays CA1-CAn are inverted through the second transfer gates TG24 and the inverter gates IN24 and simultaneously outputted.

Although the output signals from the cell arrays CA1-CAn are inverted on the basis of the logic 1 state of the clock signal CLK, the final output data Dout is the same as the input data Din because the input data Din has previously been inverted in the storage process thereof into the cell arrays CA1-CAn.

Thereafter, the third logic section 500 and the second switching section 600 operates in a similar manner to those in the circuit in FIG. 1.

As hereinbefore described, according to the present invention, desired information can be stored simultaneously in the plurality of cell arrays and successive cells can be selected in the same cell array. Also, in the test mode, the information stored in the cells can be selected simultaneously. This has the effect of grasping interferences between adjacent cells and between data bus lines in the memory device.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A test mode circuit for a memory device, comprising:
   cell array means having a plurality of cell arrays for storing input data therein;
   first switching means for receiving and directing input dam, said first switching means including a mode select switch for selecting one of test and normal modes in response to an external control signal and a plurality of cell array select switches for selecting one of the plurality of cell arrays for storing input dam in said cell array means in the normal mode in response to an external control signal;

first logic means responsive to a clock signal for, in the test mode, transferring input data from said first switching means directly and simultaneously to the plurality of cell arrays in said cell array means or inverting the input data and transferring the inverted data simultaneously to the plurality of cell arrays in said cell array means;

second logic means responsive to the clock signal for outputting directly output data signals from the plurality of cell arrays or inverting the output data signals and outputting the inverted output data signals;

third logic means including first discriminating means for in the test mode, inputting the output data signals from said second logic means and discriminating whether the inputted output data signals are the same and second discriminating means for, in the test mode, inputting the inverted output data signals from said second logic means and discriminating whether a different inputted inverted data signal is outputted from any one of the inputted inverted data signals; and second switching means including: a first cell array select switch for selecting one of the output data signals from the plurality of cell arrays in the normal mode; a second cell array select switch for selecting one of the inverted output data signals from the plurality of cell arrays in the normal mode; a first mode select switch for selecting one of the output data signal from the cell array selected by said first cell array select switch in the normal mode, and an output signal from said first discriminating means in said third logic means in the test mode; and a second mode select switch for selecting one of the inverted output data signal from the cell array selected by said second cell array select switch in the normal mode, and an output signal from said second discriminating means in said third logic means in the test mode.

2. A test mode circuit for a memory device, as set forth in claim 1, wherein said first logic means includes a plurality of logic means having their inputs for inputting simultaneously the input data applied through said first switching means and their outputs connected respectively to corresponding ones of the plurality of cell arrays in said cell array means.

3. A test mode circuit for a memory device, as set forth in claim 2, wherein the plurality of logic means each includes:

a NAND gate for inputting the clock signal, a write enable signal and a test mode select signal and outputting a transfer gate control signal in response to the inputted signals;

a first inverter gate for inverting the output signal from said NAND gate to output a transfer gate control signal;

a first transfer gate for transferring directly the input data applied through said first switching means to a respective one of the plurality of the cell arrays in response to the control signals from said NAND gate and said first inverter gate;

a second transfer gate for transferring the input data applied through said first switching means in response to the control signals from said first, inverter gate and said NAND gate; and a second inverter gate for inverting the input data transferred through said second transfer gate and outputting the inverted input data to the respective one of plurality of the cell arrays.

4. A test mode circuit for a memory device, as set forth in claim 1, wherein said second logic means includes:

a plurality of first logic means, each having its input for inputting the output data signal from a corresponding one of the plurality of cell arrays in said cell array means and its output connected to said first cell array select switch in said second switching means and to said first discriminating means in said third logic means; and a plurality of second logic means, each having its input for inputting the inverted output data signal from a corresponding one of the plurality of cell arrays in said cell array means and its output connected to said second cell array select switch in said second switching means and to said second discriminating means in said third logic means.

5. A test mode circuit for a memory device, as set forth in claim 4, wherein the plurality of first logic means each applies the output data signal from tile corresponding one of the plurality of cell arrays to said first cell array select switch in said second switching means in the normal mode and to said first discriminating means in said third logic means in the test mode and the plurality of second logic means each applies the inverted output data signal from the corresponding one of the plurality of cell arrays to said second cell array select switch in said second switching means in the normal mode and to said second discriminating means in said third logic means in the test mode.

6. A test mode circuit for a memory device, as set forth in claim 5, wherein the plurality of first logic means and the plurality of second logic means are of the same construction including:

a NAND gate for inputting the clock signal, a read enable signal and a test mode select signal and outputting a transfer gate control signal in response to the inputted signals;

a first inverter gate for inverting the output signal from said NAND gate to output a transfer gate control signal;

a first transfer gate for transferring directly the output signal or the inverted output signal from the corresponding one of the plurality of cell arrays in said cell array means to said third logic means or said second switching means in response to the control signals from said NAND gate and said first inverter gate;

a second transfer gate for transferring the output signal or the inverted output signal from the corresponding one of the plurality of cell arrays in said cell array means in response to the control signals from said first inverter gate and said NAND gate; and a second inverter gate for inverting the output signal or the inverted output signal from the corresponding one of the plurality of cell arrays transferred through said second transfer gate and outputting the inverted signal to said third logic means or said second switching means.

7. A test mode circuit for a memory device, as set forth in claim 1, wherein said mode select switch includes first and second fixed contacts and a moveable contact, said moveable contact is connected to said first fixed contact when in the normal mode and to said second fixed contact when in the test mode.

8. A test mode circuit for a memory device, as set forth in claim 7, wherein when in the normal mode, input data passes through said mode select switch and one of said cell array select switches to said cell array means.

9. A test mode circuit for a memory device, as set forth in claim 7, wherein when in the test mode, input data passes through said mode select switch and said first logic means to said cell array means.

10. A test mode circuit for a memory device, as set forth in claim 7, wherein said first logic means determines the logic state of the input date from said first switching means when in the test mode.

11. A test mode circuit for a memory device, as set forth in claim 1, wherein:
said mode select switch includes first and second fixed contacts and a moveable contact;
said moveable contact is connected to said first fixed contact when in the normal mode and to said second fixed contact when in the test mode;
when in the normal mode, input data passes through said mode select switch and one of said cell array select switches to said cell array means;
when in the test mode, input data passes through said mode select switch and said first logic means to said cell array means; and
said first logic means determines the logic state of the input data from said first switching means when in the test mode.

12. A test mode circuit for a memory device, comprising:
cell array means having a plurality of cell arrays for storing input data therein;
first switching means for receiving and directing input data, said first switching means including a mode select switch for selecting one of test and normal modes in response to an external control signal and a plurality of cell array select switches for selecting one of the plurality of cell arrays for storing Input data in said cell array means in the normal mode in response to an external control signal;
first logic means responsive to a clock signal for, in the test mode, transferring input data from said first switching means directly and simultaneously to the plurality of cell arrays in said cell array means and inverting the input data and transferring the inverted data simultaneously to the plurality of cell arrays in said cell array means;
second logic means responsive to the clock signal for outputting directly output dam signals from the plurality of cell arrays or inverting the output data signals and outputting the inverted output data signals;
third logic means including first discriminating means for, in the test mode, inputting the output data signals from said second logic means and discriminating whether the inputted output data signals are the same and second discriminating means for, in the test mode, inputting file inverted output data signals from said second logic means and discriminating whether a different inputted inverted data signal is outputted from any one of the inputted inverted data signals;
second switching means including: a first cell array select switch for selecting one of the output data signals from the plurality of cell arrays in the normal mode; a second cell array select switch for selecting one of the inverted output data signals from the plurality of cell arrays in the normal mode; a first mode select switch for selecting one of the output data signal from the cell array selected by said first cell array select switch in the normal mode, and an output signal from said first discriminating means in said third logic means in the test mode; and a second mode select switch for selecting one of the inverted output data signal from the cell array selected by said second cell array select switch in the normal mode, and an output signal from said second discriminating means in said third logic means in the test mode;
said first logic means includes a plurality of logic means having their inputs for inputting simultaneously the input data from said first switching means and their outputs connected respectively to corresponding ones of the plurality of cell arrays in said cell array means; and
said plurality of logic means each includes:
a NAND gate for inputting the clock signal, a write enable signal and a test mode select signal and outputting a transfer gate control signal in response to the inputted signals;
a first inverter gate for inverting the output signal from said NAND gate to output the transfer gate control signal;
a first transfer gate for transferring directly the input data applied through said first switching means to a corresponding one of the plurality of the cell arrays in response to the transfer gate control signals from said NAND gate and said first inverter gate;
a second transfer gate for transferring the input data from said first switching means in response to the control signals from said first inverter gate and said NAND gate; and
a second inverter gate for inverting the input data transferred through said second transfer gate and outputting the inverted input data to the corresponding one of the plurality of the cell arrays.

13. A test mode circuit for a memory device, comprising:
cell array means having a plurality of cell arrays for storing input data therein;
first switching means for receiving and directing input data, said first switching means including a mode select switch for selecting one of test and normal modes in response to an external control signal and a plurality of cell array select switches for selecting one of the plurality of cell arrays for storing input data in said cell array means in the normal mode in response to an external control signal;
first logic means responsive to a clock signal for, in the test mode, transferring input data from said first switching means directly and simultaneously to the plurality of cell arrays in said cell array means and inverting the input data and transferring the inverted data simultaneously to the plurality of cell arrays in said cell array means;
second logic means responsive to the clock signal for outputting directly output dam signals from the plurality of cell arrays or inverting the data signals and outputting the inverted data signals;
third logic means including first discriminating means for, in the test mode, inputting the output data signals from said second logic means and discriminating whether the inputted output data signals are the same and second discriminating means for, in the test mode, inputting the inverted output data signals from said second logic means and discriminating Whether a different inputted inverted data signal is outputted from any one of the inputted inverted data signals;

second switching means including: a first cell array select switch for selecting one of the output data signals from the plurality of cell arrays in the normal mode; a second cell array select switch for selecting one of the inverted output data signals and from the plurality of cell arrays in the normal mode; a first mode select switch for selecting one of the output data signal from the cell array selected by said first cell array select switch in the normal mode, and an output signal from said first discriminating means in said third logic means in the test mode; and a second mode select switch for selecting one of the inverted output data signal from the cell array selected by said second cell array select switch in the normal mode, and an output signal from said second discriminating means in said third logic means in the test mode; and said second logic means includes:
- a plurality of first logic means, each having its input for inputting the output data signal from a respective one of the plurality of cell arrays in said cell array means and its output connected to said first cell array select switch in said second switching means and to said first discriminating means in said third logic means; and
- a plurality-of second logic means, each having its input for inputting the inverted output data signal from a respective one of the plurality of cell arrays in said cell array means and its output connected to said second cell array select switch in said second switching means and to said second discriminating means in said third logic means.

14. A test mode circuit of a memory device, as set forth in claim 13, wherein the plurality of first logic means each applies the output data signal from the respective one of the plurality of cell arrays to said first cell array select switch in said second switching means in the normal mode and to said first discriminating means in said third logic means in the test mode and the plurality of second logic means each applies the inverted output data signal from the respective one of the plurality of cell arrays to said second cell array select switch in said second switching means in the normal mode and to said second discriminating means in said third logic means in the test mode.

15. A test mode circuit for a memory device, as set forth in claim 14, wherein the plurality of first logic means and the plurality of second logic means are of the same construction including:
- a NAND gate for inputting the clock signal, a read enable signal and a test mode select signal and outputting a transfer gate control signal in response to the inputted signals;
- a first inverter gate for inverting the output signal from said NAND gate to output a transfer gate control signal;
- a first transfer gate for transferring directly the output signal or the inverted output signal from the respective one of the plurality of cell arrays in said cell array means to said third logic means or said second switching means in response to the control signals from said NAND gate and said first inverter gate;
- a second transfer gate for transferring the output signal or the inverted output signal from the corresponding one of the plurality of cell arrays in said cell array means in response to the control signals from said first inverter gate and said NAND gate; and
- a second inverter gate for inverting the output signal or the inverted output signal from the respective one of the plurality of cell arrays transferred through said second transfer gate and outputting the inverted signal to said third logic means or said second switching means.

* * * * *